United States Patent [19]

Moll et al.

[11] Patent Number: 4,619,748

[45] Date of Patent: Oct. 28, 1986

[54] METHOD AND APPARATUS FOR THE REACTIVE VAPOR DEPOSITION OF LAYERS OF OXIDES, NITRIDES, OXYNITRIDES AND CARBIDES ON A SUBSTRATE

[75] Inventors: Eberhard Moll, Schellenberg; Hans K. Pulker, Triesen, both of Liechtenstein; Walter Haag, Buchs, Switzerland

[73] Assignee: Balzers Aktiengesellschaft, Liechtenstein

[21] Appl. No.: 834,757

[22] Filed: Feb. 28, 1986

[30] Foreign Application Priority Data

Mar. 1, 1985 [CH] Switzerland .......................... 928/85

[51] Int. Cl.$^4$ .............................................. C23C 15/00
[52] U.S. Cl. ............................ 204/192.31; 204/192.1; 204/298; 427/38
[58] Field of Search ............... 204/298, 192 N, 192 R; 427/38

[56] References Cited

U.S. PATENT DOCUMENTS

| | | | |
|---|---|---|---|
| 3,562,141 | 2/1971 | Morley | 204/192 N |
| 3,974,059 | 8/1976 | Murayama | 204/192 N |
| 4,112,137 | 9/1978 | Zega | 204/192 N |
| 4,197,175 | 4/1980 | Moll et al. | 427/38 |
| 4,226,897 | 10/1980 | Coleman | 204/192 N |
| 4,399,013 | 8/1983 | Sugita et al. | 204/192 N |
| 4,424,104 | 1/1984 | Harper et al. | 204/192 N |
| 4,436,770 | 3/1984 | Nishizawa | 204/192 N |
| 4,448,802 | 5/1984 | Buhl et al. | 427/38 |
| 4,559,901 | 12/1985 | Morimoto et al. | 427/38 |

FOREIGN PATENT DOCUMENTS

| | | | |
|---|---|---|---|
| 52-63125 | 5/1977 | Japan | 204/192 N |
| 54-6876 | 1/1979 | Japan | 204/192 N |
| 54-100987 | 8/1979 | Japan | 204/192 N |

OTHER PUBLICATIONS

Matthews et al., Thin Solid Films, 80 (1981) pp. 41–48.

Primary Examiner—Arthur P. Demers
Attorney, Agent, or Firm—McGlew and Tuttle

[57] ABSTRACT

For the vapor deposition of layers of oxides, nitrides, oxynitrides and carbides by ion plating, the surface to be coated is electrically insulated or mounted under insulation and during the coating an electric plasma is maintained in front of the surface to be coated, in such a way that the ion incidence density on the substrate is 0.5 to 2 mA per cm$^2$ and the surface charges to a potential of $-5$ to $-60$ volts. Thereby especially hard and firmly adhering layers are obtained.

8 Claims, 1 Drawing Figure

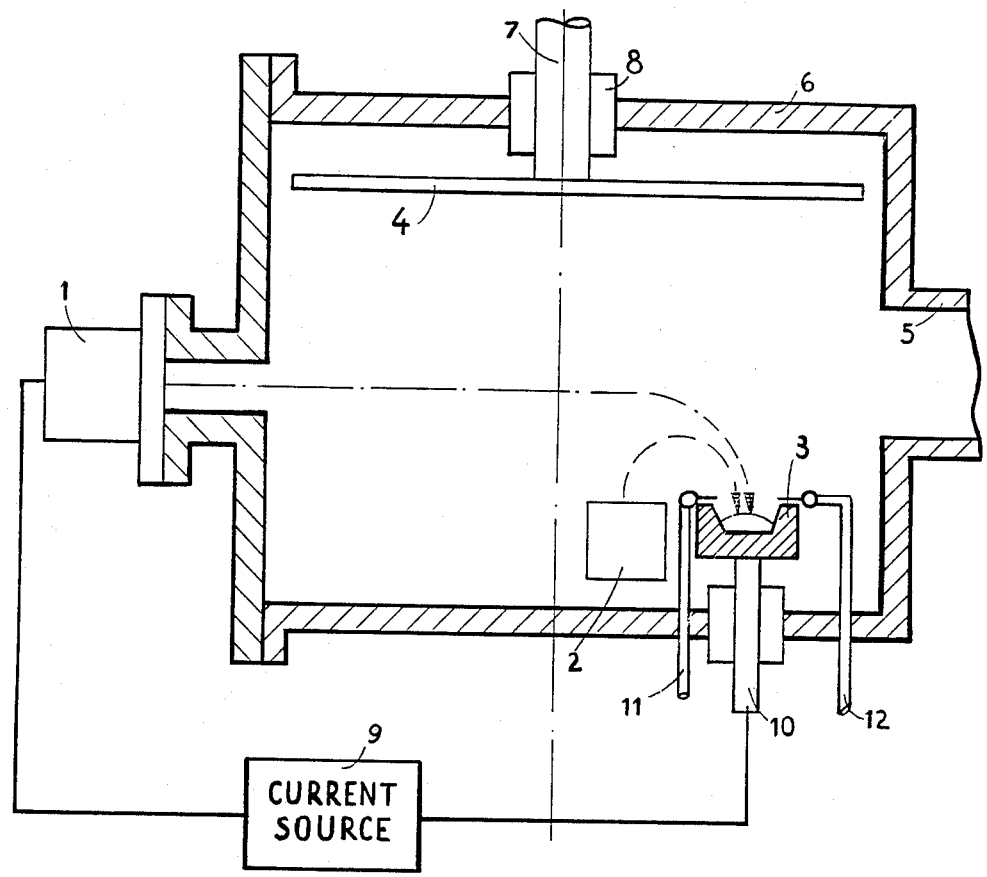

METHOD AND APPARATUS FOR THE REACTIVE VAPOR DEPOSITION OF LAYERS OF OXIDES, NITRIDES, OXYNITRIDES AND CARBIDES ON A SUBSTRATE

FIELD AND BACKGROUND OF THE INVENTION

This invention relates in general to the vapor deposition of materials on substrates and in particular to a new and useful method and apparatus for the reactive vapor deposition of layers of oxides, nitrides, oxynitrides and carbides on a substrate.

The present invention relates particularly to a method for the reactive vapor deposition of layers of oxides, nitrides, oxynitrides and carbides on supports with simultaneous partial ionization of the vapor and acceleration of the produced ions towards the surface to be coated by an electric field maintained between a vapor source as anode and the supports present at negative potential relative to the anode.

From U.S. Pat. No. 3,562,141 an arrangement is known where the material contained in a crucible is vaporized by an electron beam and the vapor is condensed on the substrates to be coated, the substrate being maintained during the coating at a negative potential of up to −500 V relative to the wall of the vapor deposition chamber. In this arrangement, a so-called low-voltage arc discharge with current strengths of up to 1000 A is maintained furthermore between a hollow cathode and the vaporized material, whereas the current flowing over the substrates could be up to 500 A. To lead away a current of this magnitude, the applied layer had to have the corresponding electric conductivity, of course. Swiss Pat. No. 645,137 discloses a method, for the performance of which a similar low-voltage arc arrangement is used, but additional vaporization power can be supplied to the material to be vaporized by means of an electron beam gun; reference is made to the possibility of keeping the substrates to be coated insulated and placing the amount itself on a potential of for example −500 V which is negative in comparison with the arc plasma. With this known method it is possible, surprisingly, to vaporize at a high vaporization rate practically all materials, i.e. also extremely temperature stable metals and dielectric materials, and to achieve also a high activation of the vapor and of any gases that may still be present in the vaporization chamber or may be introduced therein, e.g. for carrying out a reactive vapor deposition.

With a kinetic energy of the electrons of more than 1 KeV the electron beam brings about the high vaporization rate, and this also when materials of low electric conductivity are being vaporized, and the large number of low energy electrons in the low-voltage arc discharge being about an intensive activation of the vapor or of the supplied reaction gas.

In addition, this method offers the advantage that the coupling, inevitable in other methods of vaporization by means of low-voltage arcs, of process parameters such as vaporization rate, residual gas pressure, residual gas composition, ionization density, etc. can be avoided, so that optimum adaptation to the requirements of the particular application is possible.

A still persisting disadvantage of the last described method is that the application of insulating layers is feasible only to a certain maximum thickness, because, even if higher voltages (500 V) are applied to the substrates, it is no longer possible to remove the charges applied on the surface of the substrates by bombardment with electrically charged ions of the coating material.

Similar problems occur also when materials of good electric conductivity are applied on insulating supports if the electric conductivity of the support is so low that it is no longer able to remove a sufficient quantity of charge from the layers.

The attempt has been made to avoid the problems due to surface charges by providing a reticular metal electrode in front of the insulating surface to be coated. However, this solution is not satisfactory either, because such a reticular electrode causes vapor shadows on the substrates to be coated, resulting in an irregular coating, and because it weakens the intended effect of an ion-supported vapor deposition (ion plating).

When using very fine-meshed nets there is danger also of the net openings being clogged by the vaporized material.

Another known possibility of alleviating the problem of the surface charges in the application of insulating layers is to use high frequency for atomizing the material to be deposited, instead of vaporizing it as usual. In such a high frequency discharge chamber, in fact, the electrode of the smaller surface always takes on a negative charge, i.e. the substrate carrying electrode becomes negative relative to the coating chamber walls of the larger surface. Here the attempt is made to achieve a charge equilibrium in such a way that the positive charge of the substrates supplied by ions of the coating material is compensated by the much greater mobility of the electrons in plasma. If this equilibrium can be maintained during the coating without the substrates being charged to too high a negative potential, uniform coating may be expected. On the other hand, substrate surfaces charged to higher potentials may be harmed due to stronger electric discharges then occurring.

Experience has shown that the above described difficulties arise especially when supports are coated with layers of oxides, nitrides, oxynitrides and carbides.

SUMMARY OF THE INVENTION

The invention provides a method which makes it possible to apply layers precisely of these materials in a better quality, with greater hardness, density and adhesion, and also to apply layers on unheated substrates.

It was found that the method of the invention is indeed of special advantage for insulating layers of said materials and for the application of layers on insulating supports, but that also the layer quality can be greatly improved in those cases where actually a sufficient electric conductivity of the layer material exists or the supports are not insulating. To perform the method of the invention also in these last named cases, i.e. when neither the layer materials nor the supports insulate sufficiently, an appropriate insulation of the mount is provided, whereby the free flowing off of the charges from the layers is prevented.

For the performance of the method of the invention, either the surface to be coated must itself be insulated or it must be mounted under insulation in order that the surfaces to be coated will become charged to a potential of from −5 to −60 V relative to the plasma.

Accordingly it is an object of the invention to provide an improved apparatus for depositing layers of oxides, nitrides, oxynitrides and carbides on a surface to be coated so as to form especially hard and firmly adhering layers comprises a housing defining a coating chamber with a support for the substance to be coated arranged in opposition to a vaporizable substance both of which are mounted so as to be insulated from the remaining parts at least during the coating procedure and wherein an electric plasma is generated and maintained in front of the surface to be coated in such a way that the ion incident density on the substrate is from 0.5 to 2 mA per cm$^2$ and the surface charges are maintained at a potential of from $-5$ to $-60$ V.

A further object of the invention is to provide a device for coating substrates which is simple in design, rugged in construction and economical to manufacture.

A further object of the invention is to provide a method for the vapor deposition of layers of oxides, nitrides, oxynitrides and carbides which comprises ion plating while the surface to be coated is electrically insulated or mounted on the insulation, and during the coating maintaining an electric plasma in front of the surface to be coated in such a way that the ion incidence density on the substrate is from 0.5 to 2 mA per cm$^2$ and the surface is charged to a potential of from $-5$ to $-60$ V.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

The only FIGURE of the drawings is a schematic sectional view of a coating device constructed in accordance with the invention.

DESCRIPTION OF THE PREFERRED EMBODIMENT

Referring to the drawing in particular the invention embodied therein comprises a device for deposition of layers of oxides, nitridges, oxynitrides and carbides by ion plating. The device comprises a housing 6 defining a coating chamber therein with a vapor source surface for the material to be vaporized, generally designated 3, and a substrate support 4 for the substance to be coated which is arranged at a negative potential in respect to the vapor source surface which forms an anode. Means are provided for applying a potential between the vapor source surface and the support which is a current source 9. Means are also provided for effecting the insulation of the vapor source surface 3 and the substrate support 4 relative to the housing 6. The embodiment illustrated includes an insulator 8 arranged around a supporting rod 7 which rotatably engages in the insulator 8. The vaporizable substance is maintained in the vapor source surface in the form of a crucible 3 which is mounted in an insulating device 10.

In accordance with the invention the coating device includes a cathode chamber 1 of the low-voltage arc discharge, an electron beam gun 2 which furnishes the electrons of energy. Further, a crucible 3 containing the material to be vaporized, and a substrate 4 are arranged in spaced opposite relationship within a coating chamber 6. The holder 4 can be covered by the substrates on which thin layers of the vaporized material are to be deposited. The drawing shows also a pump connection 5 for evacuation of the coating chamber 6 to a suitable vacuum, e.g. a pressure of $10^{-4}$ mb. For applying thin layers of materials not insulating by themselves, the substrate holder is attached to the ceiling of the coating chamber 6, by means of a rod 7 and an insulator 8. Due to the electric gas discharge maintained during the operation of the apparatus, the substrate holder 4 takes on a negative potential during the condensation of the vapor, with the result that positive ions from the activated vapor and from the residual gas (plasma) are accelerated toward the substrates.

The low-voltage arc is run between the cathode chamber 1 and the crucible 3 by means of the current source 9. The low-voltage arc can then be maintained by a connection of the positive pole of the current source 9 to ground or it can be kept at floating potential, i.e. without connection with the housing of the coating chamber. In the latter case, the positive pole of the current source 9 is connected to the holding rod 11, passed through the bottom of the chamber 6 by means of an insulator 10, for the crucible 3. The drawing indicates that the attachment of the substrate holder on the ceiling of the coating chamber could be done also by means of a holding rod designed for rotary movement of the substrate holder, the advantage of such a rotary movement being greater evenness of the applied layers. If the shaft is connected to a motor, provision must be made, of course, that if the layers or the supports are not themselves insulating, their insulated retention is preserved, as can be done, e.g. by insulating coupling between drive motor and shaft.

Other details useful for the practical operation of such a coating apparatus have not been shown in the attached drawing in the interest of greater clarity, such as cooling water ducts, valves for the introduction of gases into the cathode chamber of the lowvoltage arc discharge, auxiliary coils for the production of magnetic fields, e.g. for the cathode chamber of the low-voltage arc, auxiliary vacuum pumps for the operation of the electron source, etc.; reference is made to Swiss Pat. No. 654,137 in respect to such details.

To carry out the method of the invention, the substrates to be coated are fastened on the side of the holding device 4 turned toward the vapor source, the material to be vaporized is placed in crucible 3, and the vaporization chamber is closed and evacuated. After a pressure of about $10^{-6}$ mb is reached, enough argon is introduced into the cathode chamber of the low-voltage arc discharge for the pressure in the receiver to rise to about $10^{-4}$ mb. Thereupon the low-voltage arc can be ignited, resulting in a flow of e.g. 35 amperes at a voltage of 60 V between the anode (crucible 3) and the cathode. The substrates will then assume a negative potential of about 30 V in comparison to the arc plasma, with the result that positive ions are accelerated from the plasma towards the substrates. For the fulfillment of the feature that during coating, an electric plasma is maintained by means of an electric gas discharge before the surface to be coated, so that said surface is charged to a potential of $-5$ to $-60$ V relative to the plasma potential, it is necessary to provide a gas inlet ending in the vicinity of the anodically connected crucible. For this purpose the coating apparatus shown in the drawing has two gas feed lines 11 and 12, which end or discharge just at the crucible edge. The density of the gas supplied through these lines is greatest in the area of the crucible opening. Thereby an especially strong activation both of the supplied gas and of the vaporized material by the electric gas discharge before the crucible acting as anode is achieved.

Depending on which of the initially mentioned layer materials are to be obtained by the reaction of the vapor with the supplied gas, oxygen, nitrogen, hydrocarbons and various other gases are introduced. The general guidelines for the selection of the reaction gas have been described elsewhere but concrete examples are given below.

In a first embodiment, $TiO_2$ layers were to be deposited on the substrates. To this end, metallic titanium was vaporized from the crucible at a temperature of about 1900° C. Simultaneously oxygen was introduced as reaction gas via lines 11 and 12, there being measured over the crucible a maximum oxygen partial pressure of about $8 \times 10^{-4}$ mb. The partial pressure of the argon admitted via the cathode chamber 2 in the coating chamber was $2 \times 10^{-4}$ mb. Between the hot cathode in the cathode chamber and the crucible as anode a potential difference of 70 V was applied, the arc current being 60 A. Under these operating conditions a growth rate of the layers of 3.5 ang per second was obtained. In the example discussed, the forming $TkO_2$ layers were themselves electrically insulating and it was possible to produce the coating on insulating supports, e.g. glass plates, as well as on metal supports in equally good quality. In a second embodiment, $SiO_2$ layers were produced on supports. The applied argon and oxygen pressure was the same as in the first example. Pure silicon was vaporized in the crucible, selecting for the arc voltage this time 85 V; the arc current was 65 A, the vapor deposition rate 4.9 ang per second. The $SiO_2$ layers thus produced were hard, absorption-free, and adhered well both on metallic and on insulating supports.

TABLE

| | EXAMPLE NO. | | | | |
|---|---|---|---|---|---|
| | 1 | 2 | 3 | 4 | 5 |
| Vaporized material | Ti | Si | Si | Si | Si |
| $P_{Ar} \times 10^{-4}$ mb | 2 | 2 | 2 | 2 | 2 |
| Partial pressure of the reactive gases (mb) | $8 \times 10^{-4}$ $O_2$ | $8 \times 10^{-4}$ $O_2$ | $8 \times 10^{-4}$ $N_2$ | $1 \times 10^{-3}$ $C_2H_2$ | $4 \times 10^{-4}$ $O_2$ $8 \times 10^{-4}$ $N_2$ |
| Arc volgate (V) | 70 | 85 | 74 | 65 | 75 |
| Arc current (amp.) | 60 | 65 | 70 | 70 | 70 |
| Condensation (layer material) | $TiO_2$ | $SiO_2$ | SiN | SiC | $SiO_xN_y$ |

In another example SiN layers were obtained, at an argon partial pressure of $2 \times 10^{-4}$ mb in the coating chamber and and a nitrogen partial pressure of $8 \times 10^{-4}$ mb at an arc voltage of 74 V and an arc current of 70 A. A coating rate of 4.1 ang per second was reached. The layers obtained were extremely hard and adhered firmly on steel supports. These steel supports were not heated over 100° C. during the production of the layers, so that the described example permitted the production of tool coatings where, as is known, the drawing temperature of the respective tool steel must not be exceeded.

A similar example relates to the production of SiC layers. In this case $C_2H_2$ was used as reactive gas, with a partial pressure of $1 \times 10^{-3}$ mb during application of the layers. The further details can be seen from the above tabular compilation of all examples.

Lastly there were produced layers with the composition $SiO_xN_y$, that is, layers which could contain silicon, oxygen and nitrogen in mixture varying with the manufacturing conditions. To this end silicon was vaporized under simultaneous action of oxygen and nitrogen which were admitted into the coating chamber as reactive gases via the two lines 11 and 12, in order there to build up during the coating a partial pressure of $P_{O2} = 4 \times 10^{-4}$ mb and $P_{N2} = 8 \times 10^{-4}$ mb. The argon partial pressure was adjusted at $2 \times 10^{-4}$ mb, the arc voltage at 75 V and the arc current 70 A, and a coating rate of 4.2 ang per second was reached.

While specific embodiments of the invention have been shown and described in detail to illustrate the application of the principles of the invention, it will be understood that the invention may be embodied otherwise without departing from such principles.

What is claimed is:

1. A method for the vapor deposition of layers of oxides, nitrides, oxynitrides, and carbides which comprises ion plating while the surface to be coated is electrically insulated or mounted on the insulation, and during the coating maintaining an electric plasma in front of the surface to be coated in such a way that the ion incidence density on the substrate is from 0.5 to 2 mA per $cm^2$ and the surface is charged to a potential of from $-5$ to $-60$ V.

2. A method for the reactive vapor deposition of layers of oxides, nitrides, oxynitrides and carbides on supports by the partial ionization of a vaporizing material to produce ions and to accelerate them toward the surface to be coated and by creating an electric field and maintaining the field between a vapor source as an anode and a support pressent as a negative potential relative to the anode and wherein the surface to be coated is electrically insulated during the method and the ion incidence density on the substrate is maintained of from 0.5 to 2 mA per $cm^2$ and wherein during coating and electric plasma is maintained by means of an electric gas discharge before the surface to be coated, so that the surface is charged to a potential of from $-5$ to $-60$ V relative to the plasma potential and wherein the gases required for the reactive vapor deposition and to be reacted with the vaporizable substance are supplied to the anode.

3. A method according to claim 2, wherein the gases are supplied to the site of the highest vapor density before the anode.

4. A method according to claim 2, wherein the supplying of gas occurs in the zone of the anomalous anode fall area.

5. A method according to claim 2, wherein the plasma is the positive column of a low voltage arc discharge.

6. A method according to claim 2, wherein the arc voltage of the low voltage arc discharge is selected so that an anomalous anode fall of at least 6 V appears.

7. A method according to claim 2, wherein the arc discharge is carried out with a current strength of at least 30 amp.

8. A device for the vapor deposition of layers of oxides, nitrides, oxynitrides and carbides by ion plating comprising a housing defining a coating chamber, an anode having a vapor source surface for the material to be vaporized, a substrate support for the substance to be coated maintained at a negative potential in respect to said anode, means for applying a potential between said vapor source surface and said support, means effecting the insulation of said vapor source substance and said substrate support relative to said housing, and a current source for maintaining a plasma potential and an electric plasma before said substrate support so that said support is charged to a potential of −5 to −60 V relative to said plasma potential, and means for supplying a gas discharge into said housing adjacent said substance support which are required for the vaporization and vapor deposition of the substance on the substrate and which is to be reacted with the vaporizable substance supplied to the anode.

* * * * *